United States Patent [19]

Rappat et al.

[11] Patent Number: 5,118,949
[45] Date of Patent: Jun. 2, 1992

[54] PROCESS FOR THE PROTECTION OF A DIAPHRAGM DURING THE GENERATION OF ELECTRON BEAM PULSES

[75] Inventors: Franz J. Rappat, Eichenau; Wilhelm Scheffels, Hersching; Ulrich Schwab, Puchheim, all of Fed. Rep. of Germany

[73] Assignee: Messer Griesheim, Fed. Rep. of Germany

[21] Appl. No.: 603,460

[22] Filed: Oct. 25, 1990

[30] Foreign Application Priority Data

Nov. 17, 1989 [DE] Fed. Rep. of Germany ...... 3938221

[51] Int. Cl.⁵ ............................................. H01J 3/32
[52] U.S. Cl. ........................ 250/396 R; 250/396 ML; 250/398
[58] Field of Search ........ 250/396 R, 396 ML, 505.1, 250/310, 311, 397, 398

[56] References Cited

U.S. PATENT DOCUMENTS

| | | | |
|---|---|---|---|
| 4,439,685 | 3/1984 | Plies | 250/398 |
| 4,445,041 | 4/1984 | Kelly et al. | 250/505.1 |
| 4,467,205 | 8/1984 | Beisswenger et al. | 250/396 R |
| 4,721,909 | 1/1988 | Richardson | 250/396 R |
| 4,839,520 | 6/1989 | Garth | 250/396 R |

*Primary Examiner*—Jack I. Berman
*Assistant Examiner*—Kiet T. Nguyen
*Attorney, Agent, or Firm*—Connolly & Hutz

[57] ABSTRACT

The invention relates to a process for the protection of a diaphragm during the generation of electron-beam pulses by means of alternately deflecting the electron beam onto the diaphragm and onto a processing site.

In order to prevent damage to the diaphragm from the thermal effect of the electron beam, the electron beam is distributed with respect to space and/or time over an enlarged striking surface.

16 Claims, 5 Drawing Sheets

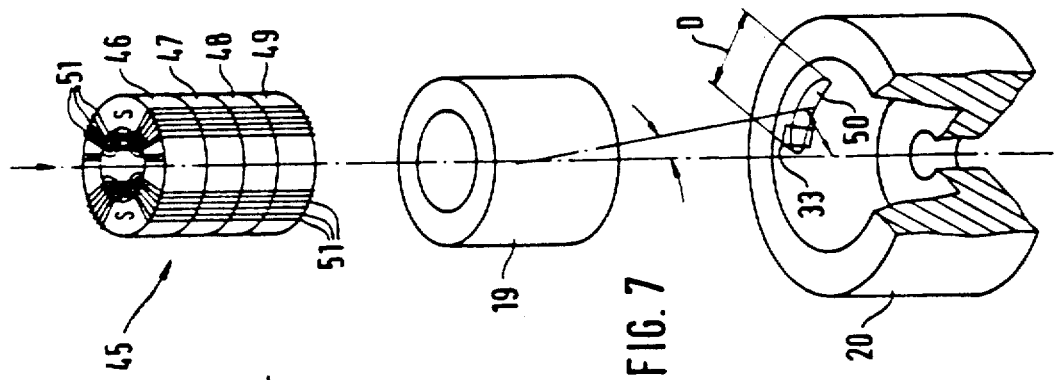

PROCESS FOR THE PROTECTION OF A DIAPHRAGM DURING THE GENERATION OF ELECTRON BEAM PULSES

BACKGROUND OF INVENTION

The invention relates to a process for the protection of a diaphragm during the generation of electron-beam pulses by means of alternately deflecting the electron beam onto the diaphragm and onto a processing site.

When electron beams are used for processing purposes, the processing result is largely determined by the energy which is absorbed or transferred by means of heat conduction to a certain volume element. On the basis of the volume-specific energy expenditures for the different effects and materials, a demand is made for the electron beam device to have values of the beam parameters which can be adapted to the processing task. This applies, among other things, to controlling the duration of exposure to the beams at the given processing site.

West German patent DE 24 51 366 C3 discloses an electron-beam device in which an electron beam, which is focused onto the workpiece through a magnetic lens, can be deflected by a magnetic deflection system alternately onto an undeflected work position in which it strikes the workpiece, and a deflected resting position in which it strikes a diaphragm.

SUMMARY OF THE INVENTION

The present invention is based on the task of avoiding damage to the diaphragm stemming from the thermal effect of the electron beam when this electron beam is deflected onto the diaphragm.

This task is fulfilled by distributing the electron beam with respect to space and/or time over an enlarged striking surface.

The invention makes it possible to use a diaphragm to generate electron-beam pulses, even in the case of high power levels, without damage occurring to the diaphragm. As a result of the process, especially melting of the diaphragm surface and thus its destruction are prevented.

THE DRAWINGS

Figure 3:
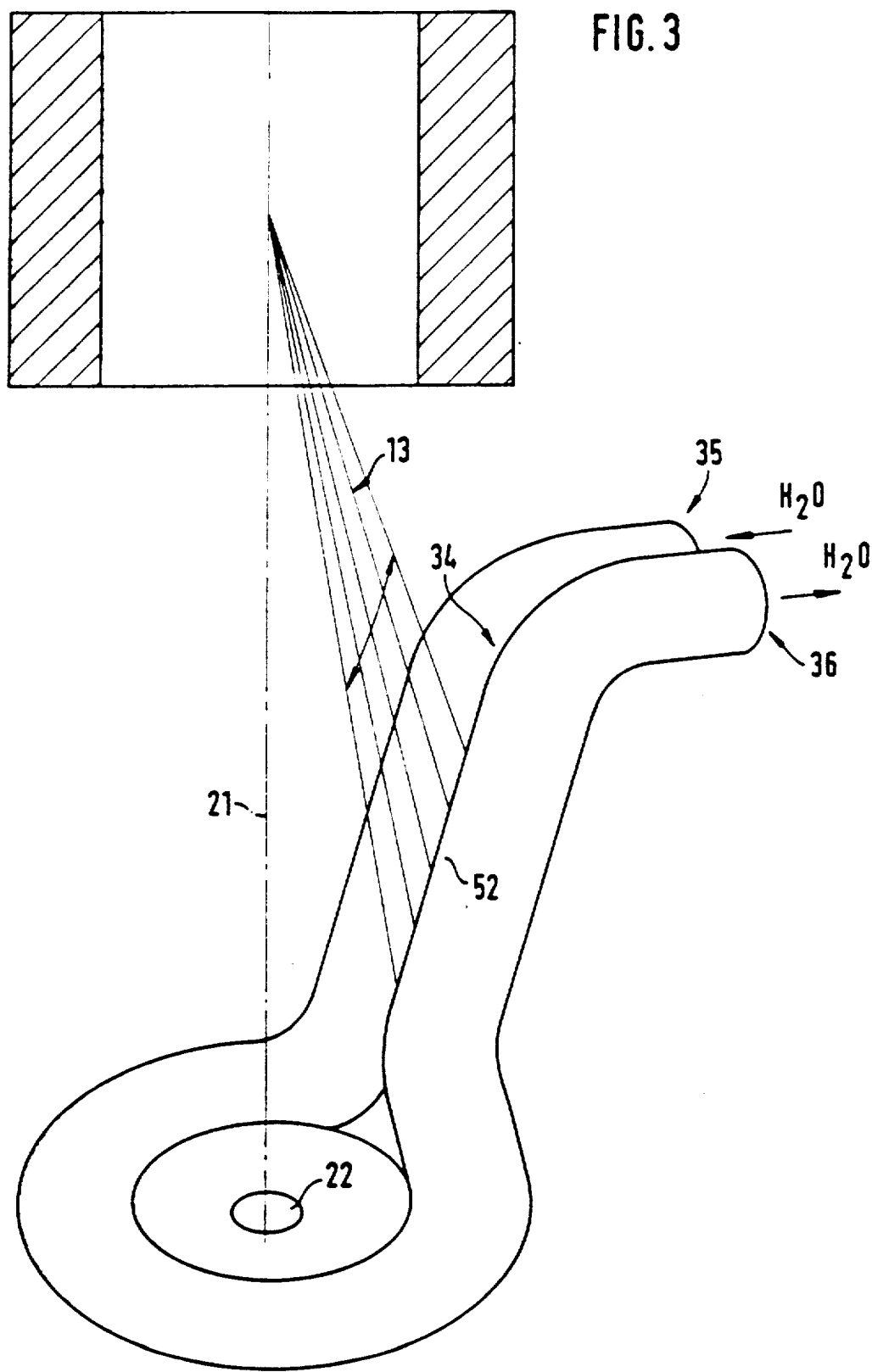
FIG. 3 is an advantageous embodiment of a diaphragm.
Figure 4B:
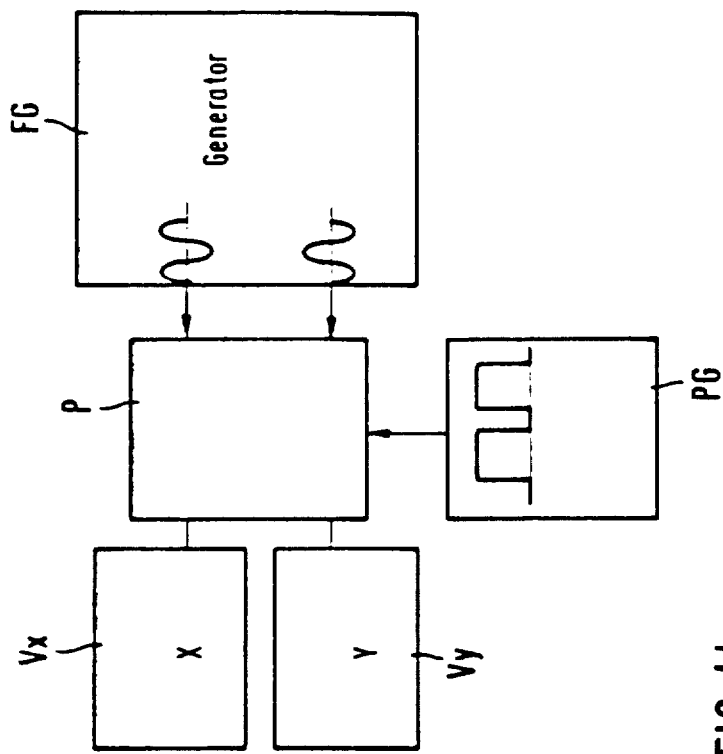
Figure 4A:
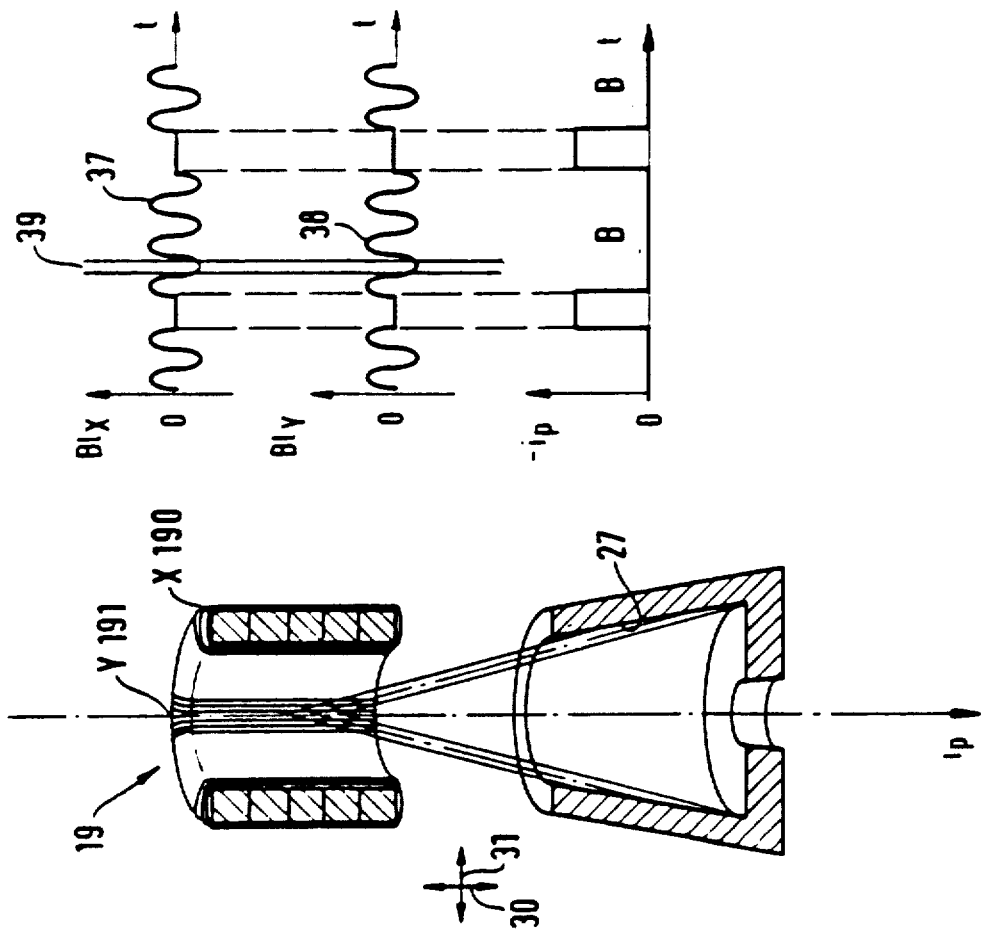
Figure 5B:
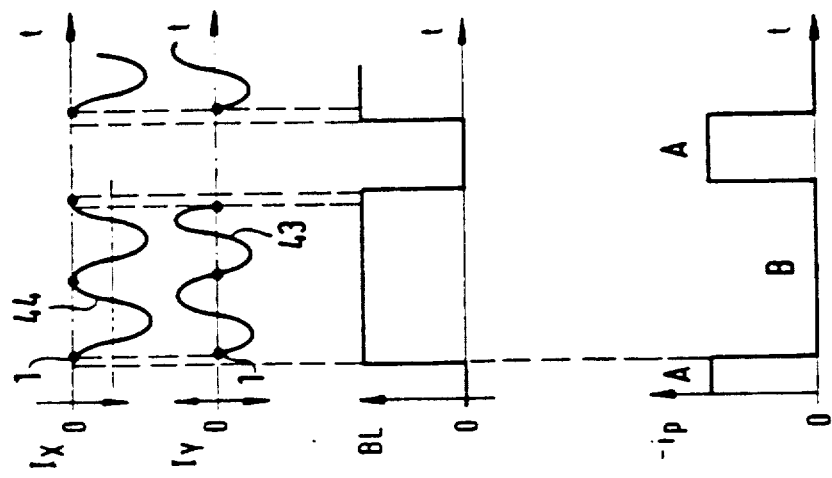
Figure 5A:
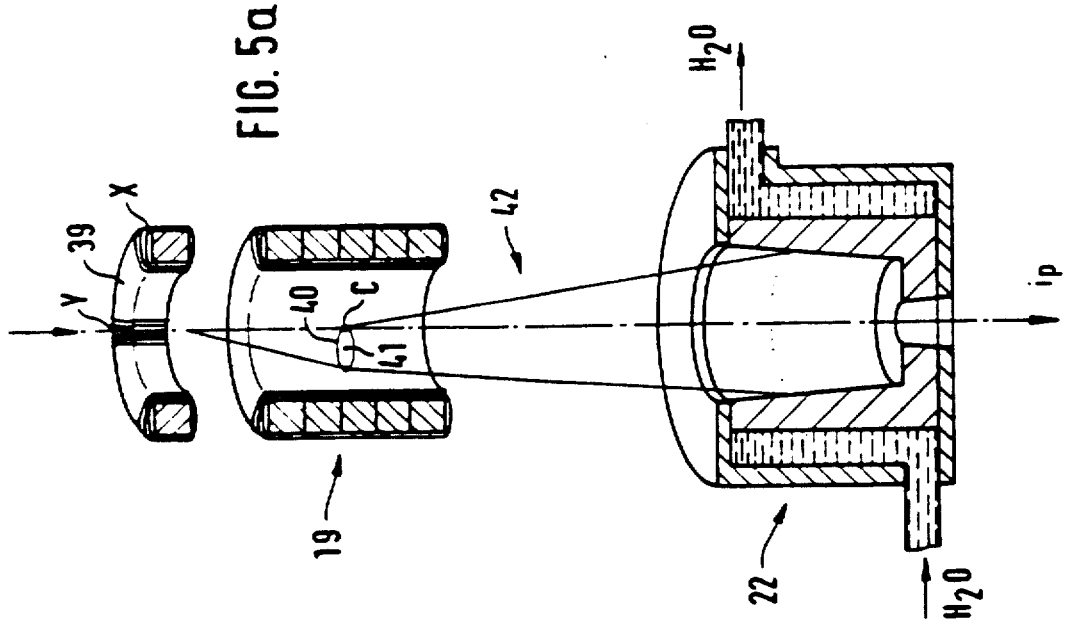

FIG. 4a–b is a functional block diagram of a deflection system with two deflection directions;

FIG. 5a shows separate deflection systems for the alternate deflection of the electron beam onto the diaphragm and onto a processing site;

FIG. 5b shows the corresponding beam flow for a circular deflection, with the deflection system shown in FIG. 3;

FIG. 6 shows a control device for the separate actuation of the deflection movement and of the jiggling; and FIG. 7 shows an embodiment of the invention with a blanking deflection system, in which the electron beam is deflected alternately onto the diaphragm and onto the processing site, and is expanded on the diaphragm.

DETAILED DESCRIPTION

Figure 1:
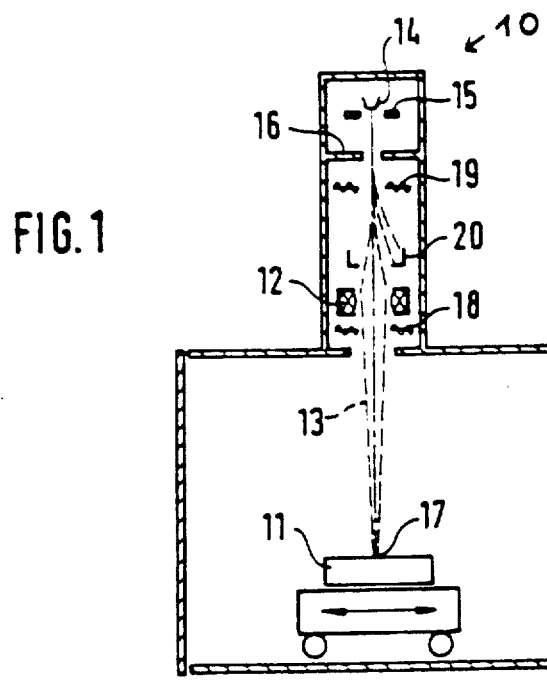
FIG. 1 is a schematic representation of an electron-beam gun according to the invention.

FIG. 1 shows an electron-beam gun 10 to process workpieces which, in a generally known manner, contains a beam generation system with a cathode 14 which serves as an electronbeam source, a control electrode 15 and an anode 16. The beam generation system provides an electron beam 13, which focuses through a magnetic lens 12 onto the workpiece 11 or onto a processing site 17, and which is directed by a magnetic deflection system 18 to the processing site 17.

Between the lens and the anode, at low beam power levels and pulse times < 10 μs, there is at least one electrostatic blanking deflection system 19 or, in the case of higher beam power levels, at least one magnetic blanking deflection system 19. With the blanking deflection system 19, electron-beam pulses can be generated by alternately deflecting the electron beam 13 onto a diaphragm 20 located inside the beam guiding system or else onto the processing site 17.

The diaphragm 20 is preferably designed as a pot-like vessel which allows fluid to pass through (FIG. 2a), with an opening 22 located coaxially to the beam axis 21, while the electron beam 13 can be deflected onto the processing site through this opening 22. Due to the approximately cylindrical inner surface 27, when the diaphragm opening 22 is axially positioned, almost all of the back scattered electrons which are generated when the electron beam strikes remain inside the diaphragm pot, accompanied by an increase of the striking surface 33 of the electron beam 13 on the inner surface 27 of the diaphragm 20. The expansion of the electron beam 13 is achieved in that the incline of the inner surface 27 is advantageously changed with respect to an inner surface 27 of the diaphragm 20 running vertically 53 to the deflected electron beam 13. On the approximately cylindrical outer wall, the diaphragm 20 is provided with a lead sheathing 28 in order to weaken the x-ray radiation generated in the diaphragm 20.

Figure 2A:
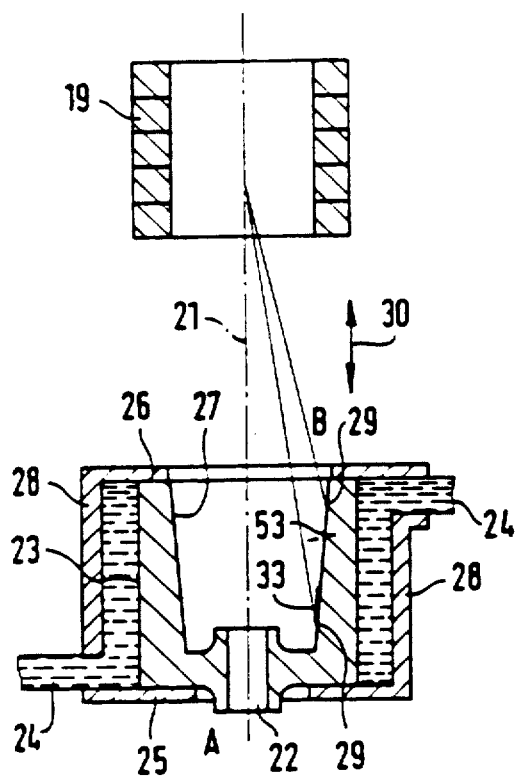
FIG. 2a is an embodiment of the invention in which the electron beam is deflected by a blanking deflection system alternately onto the diaphragm and onto the processing site, and is jiggled on the diaphragm.

In FIG. 2a, the diaphragm 20 is connected to a water circulation or water-flow cooling system 24, which essentially flows around the diaphragm outer sheathing 23. Naturally, it is also possible to connect the front diaphragm plate 25 with the diaphragm opening 22 and/or the front diaphragm rim 26 to a water-cooling system.

Figure 2B:
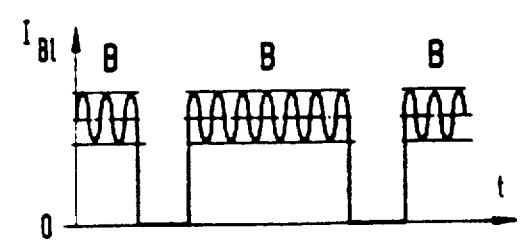
FIG. 2b shows the corresponding pulse beam flow during the pulse release and pulse pause.

According to an advantageous embodiment, the alternate swiveling back and forth of the electron beam 13 with respect to the diaphragm opening 22 and the jiggling of the electron beam 13 onto the inner surface 27 of the diaphragm can take place simultaneously by means of the blanking deflection system 19. In this case, depending on the design and the control of the blanking deflection system 19, jiggling paths 29 can be generated in a linear manner in a deflection direction 30 (FIGS. 2a and 2b) or in a circular manner in two deflection directions 30, 31 (FIG. 4).

FIG. 4 shows a functional block diagram for the actuation of the blanking deflection system 19 in two deflection directions which, in its basic version, is also suitable for linear jiggling, so that it is possible to dispense with a separate description of the simplified circuit design for the linear jiggling.

FIG. 2a shows the modulated actuation of the blanking deflection system 19 for linear jiggling and the corresponding pulse beam flow up during the pulse release A (the electron beam 13 strikes the workpiece) and during the pulse pause B (The electron beam 13 strikes the diaphragm 20) over the course of time.

The pulse actuation of one single deflection amplifier Vx (FIG. 5a) occurs in such a way that, rather than using a constant pulse roof for swiveling out the electron beam 13 away from the diaphragm opening 22, a high-frequency oscillation is superimposed over the pulse. As a result, the energy or heat effect per unit of time of the electron beam 13 which strikes a striking surface 33 of the diaphragm 20 is reduced.

In the case of higher beam power levels, it is more advantageous if the electron beam 13 does not strike an even surface, but rather it strikes a longitudinal, slit-like recess 34 with an accordingly enlarged striking surface, which consists of components 35, 36 with curved surfaces 52 (FIG. 3). In this case, this elongated recess can be formed by two parallel copper pipes 35, 36 which are in contact with each other, and through which water flows. These pipes are oriented virtually parallel to the beam axis 21 of the undeflected electron beam 13 and they are welded together on their contact line, along which the jiggled electron beam 13 strikes. Naturally, it is also possible for the front diaphragm plates to be connected to the axial diaphragm opening 22 and the diaphragm outer sheathing can be connected to the water cooling system.

FIG. 4 shows a blanking deflection system 19 for the actuation of the blanking deflection system in two deflection directions.

The blanking deflection system 19 consists of two systems 190, 191 for the X and the Y deflection direction 30, 31, and it generates a fast circular deflection in the pulse pause B, whereby the electron beam 13 strikes the inner surface 27 of the diaphragm 20. The design of the diaphragm 20 corresponds largely to that of the embodiment shown in FIG. 2.

An expansion of the surface exposed to the electron beam is achieved by means of an incline of the inner surface 27 which runs at an angle to the diaphragm opening 22 and which enlarges the surface of the base plate on the other hand, however, the inlet opening for the (rotation-symmetrical) diaphragm pot can be kept small in this manner. This has the advantage that the number of back-scattered beam electrons that emerge again from the pot can be kept small. The same objective is served by designing the area of the diaphragm opening 22 for the electron-beam outlet as a protruding rim.

The actuation of the pulse pause B during the blanking process takes place by applying the sinus functions 37, 38 to the two deflection directions X, Y (30,31) of the blanking deflection system 19 the two sinus functions 37, 38 have the same maximum amplitudes, but they are time-staggered with respect to each other by p/2 (39). For the beginning of the electron-beam pulse (i.e.: beam deflection equals zero), the amplitudes of both sinus functions are simultaneously reduced to zero within a very short period of time, e.g. with the switching stage P for amplitude modulation shown in FIG. 4.

The switching stage P is connected on one side with a programmable function generator FG for the circular jiggling and with a pulse generator PG for the swiveling back and forth of the electron beam 13. The systems 190 and 191 are actuated via deflection amplifiers Vx and Vy connected with the switching stage P on the output side.

According to another embodiment (FIG. 5a), the circular jiggling is carried out with an additional deflection system 39 whose time constant can be the same as or larger than that of the deflection system 19 for the swiveling of the beam. This design is suitable as an additional complement for high beam power levels, when the blanking deflection system 19 is used with only one deflection direction and a simple, rotation-symmetrical blanking diaphragm pot 20 (like in FIGS. 2a, 4 and 5a) as the standard version. Attention must be paid to the fact that the electron beam circular deflection must only take place in the pulse pause B, whereby corresponding to the time constants of the deflection systems 39, 19, the use of the circular deflection only begins after the complete swiveling out of the electron beam from the diaphragm opening 22. Accordingly, the swiveling in of the beam into the diaphragm opening 22 (the ending of the pulse pause B) can only be started when the jiggle deflection amplitude has dropped to zero.

FIG. 5a shows the actuation of the two deflection devices X, Y (30,31) in case the additional deflection system (in the beam direction) is arranged before the blanking deflection system 19. The first deflection system 39 follows a circle 40 which touches the beam axis 21, if all of the deflections are zero but if its mid-point 41 is deflected off in the direction opposite from the direction in which the blanking deflection system 19 swivels the electron beam 13 to the side 42. The radius of the circle 40 has the same length as the segment by which the electron beam is swiveled at the site of the blanking deflection system 19. When a computer is used, the circle 40 followed by the first deflection system 39 can be actuated as follows:

As soon as the blanking deflection system has swiveled the beam from the diaphragm opening 22, the deflection system 39 fundamentally starts the circle rotation at point C and ends the last rotation which is still completely possible before the end of the pulse pause B, again at point C, that is, at the place on the circle at which the coil flows of the two coil pairs X, Y are equal to zero. There, the electron beam stops until it is again swiveled into the diaphragm opening 22 by the blanking deflection system 19. The computer calculates the possible number of rotations as a function of the duration of the pulse pause B.

FIG. 5b shows the modulated actuation of the blanking deflection systems 19, 39 and the corresponding pulse-beam flow ip at pulse release A and at pulse pause B over the course of time. The actuation of pulse pause B is done by applying the sinus functions 43, 44 to the two deflection directions X, Y (30,31) of the blanking deflection system 39. The two sinus functions 43, 44 have the same maximum amplitudes, but they are time staggered with respect to each other by p/2 (39). The sinus function 43 reaches the value zero at the half amplitude and the sinus function 44 reaches the value zero at the maximum amplitude.

FIG. 6 shows a circuit for the actuation of the circular deflection of the deflection system 39 in the pulse pauses B. The circuit consists of a tension-controlled pulse generator PG (frequency and keying ratio are provided via analog signals $O-10$ V), which is connected to a computer circuit R via an inverter I with a subsequent time-delay circuit V (in the μs range). In the computer circuit R, the time for the circular jiggling is calculated on the basis of the set analog values for the frequency and keying ratio of the pulse generator and for the frequency of the programmable function generator. The computer circuit R is connected to a programmable function generator GF with which the frequency can beset via an analog tension 0–10 V. The output function can be programmed by means of a keyboard.

The output signal of the pulse generator PG is inverted by means of an inverter I and transmitted via a time-delay logic V. The control voltage for a time element is generated in the computer circuit R on the basis of the actuation signals for the pulse generator PG and for the programmable function generator GF. The digital signal generated from the inverter I and from the time-delay logic V controls the release of the function generator GF in the pulse pause B via the computer circuit R, whereby the function generator GF is programmed in such a way that, after the release is removed, the programmed function is still carried out in its entirety.

Figure 2B:
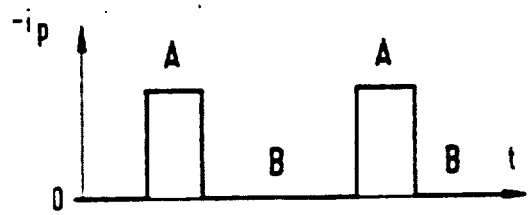

FIG. 7 schematically shows a blanking deflection system 19 with a pot like, lead sheathed and fluid-cooled diaphragm 20 according to FIGS. 2 and 5. In the beam direction before the blanking deflection system 19, there is an electronoptic beam expansion system 45 arranged coaxially to the beam axis 21, preferably with Stigmator coils, by means of which the electron beam 13 can be expanded. As a result of these measures, the energy or heat effect of the electron beam 13 striking a striking surface 33 is advantageously reduced. During the pulse pause, that is, when the electron beam 13 is deflected onto the cooled inner surface 27 of the diaphragm pot 20 by means of the blanking deflection system 19, coil current also flows through the four coils 46 to 49 of the "astigmatism system" which is designed in such a way that a strong astigmatism is effected onto the electron beam. The magnetomotive force and the azimuth position (with respect to that of the blanking deflection system 19) are selected in such a way that the otherwise circular beam cross section is pulled apart at the site of the diaphragm pot 20 to form a long and slender ellipsis 50, whose large axis D is oriented almost parallel to the rim of the diaphragm pot 20. The large axis D of the ellipsis 50 preferably has a length of more than 10 mm, which is achieved by winding around the coils a prescribed number of ampere windings 51 in the coils of the astigmatism system and through the length of this system (in the beam direction), i.e. the length of the "iron core" made up of several ferrite rings. Advantageously, the number of windings of the coils can be reduced for a fixed electron optical "effect" of the system at a constantly prescribed coil current with an elongation of the core, thus raising the limiting frequency of the system. This frequency must be high (e.g. 10 kHz or more) so that the current change slope is short enough when the coil current is switched on and off.

Corresponding to the time constant of the blanking deflection system 19 and of the beam expansion system 45 (e.g. of the astigmatism system), the latter system may not be used until the swiveling out of the electron beam 13 from the diaphragm opening 22 of the diaphragm pot 20 has definitely been completed. Accordingly, the switching off procedure of the beam expansion system 45 (that is, the switching off of the coil current of the astigmatism system) must have completely drop to zero in time before the swiveling back of the electron beam 13 into the diaphragm opening 22. This time difference is, for example, less than 3 μ. Consequently, if a shorter pulse pause is desired, the switching on of the beam expansion system should be avoided, something which can be taken into account in the case of programmed pulse actuation.

What is claimed is:

1. In a process for the protection of a diaphragm during the generation of electron-beam pulses by means of alternately deflecting the electron beam onto the diaphragm and onto a processing site, the improvement being in that, in order to prevent overheating of the diaphragm surface, the electron beam is distributed with respect to space and/or time over an enlarged striking surface and the electron beam being expanded during tis striking time or the diaphragm.

2. Process according to claim 1, characterized in that the electron beam is periodically jiggled during its striking time on the diaphragm.

3. Process according to claim 1, characterized in that the electron beam is periodically jiggled in a circle or linearly with a frequency greater than 5 kHz.

4. Processing according to claim 1, characterized in that the electron beam is jiggled by the actuation of the same deflection system and/or alternately deflected onto the diaphragm and onto the processing site.

5. Process according to claim 1, characterized in that the electron beam is deflected onto the diaphragm alternately by the actuation of a first deflection system and onto the processing site and in that it is jiggled by the actuation of a second deflection system.

6. In a process for the protection of a diaphragm during the generation of electron-beam pulses by means of alternately deflecting the electron beam onto the diaphragm and onto a processing site, the improvement being in that, in order to prevent overheating of the diaphragm surface, the electron beam is distributed with respect to space and/or time over an enlarged striking surface, the electron beam being periodically jiggled during its striking time on the diaphragm, and the electron beam being expanded during its striking time on the diaphragm.

7. Process according to claim 6, characterized in that the electron beam is periodically jiggled in a circle or linearly with a frequency greater than 5 kHz.

8. Process according to claim 7, characterized in that the electron beam is jiggled by the actuation of the same defection system and/or alternately deflected onto the diaphragm and onto the processing site.

9. Process according to claim 7, characterized in that the electron beam is deflected onto the diaphragm alternately by the actuation of a first deflection system and onto the processing site and in that it is jiggled by the actuation of a second deflection system.

10. Process according to claim 9, characterized in that the electron beam is jiggled after the completion of the swiveling out onto the diaphragm and is deflected onto the processing site after the completion of the jiggling or expanding.

11. Process according to claim 7, characterized in hat the electron beam is jiggled after the completion of the swiveling out onto the diaphragm and is deflected onto the processing site after the completion of the jiggling or expanding.

12. In a process for the protection of a diaphragm during the generation of electron-beam pulses by means of alternately deflecting the electron beam onto the diaphragm and onto a processing site, the improvement being in that, in order to prevent overheating of the diaphragm surface, the electron beam is distributed with respect to space and/or time over an enlarged striking surface, and the electron beam being jiggled after the completion of the swiveling out onto the diaphragm and being deflected onto the processing site after the completion of the jiggling or expanding.

13. In a device for the protection of a diaphragm during the generation of electron-beam pulses by means of alternately deflecting the electron beam onto the diaphragm and onto a processing site, with an electron-beam generator and a beam guiding system, the improvement consisting of at least one deflection system or one beam expansion system by means of which said electron beam can be jiggled or expanded, a cooled diaphragm onto which said electron beam is deflected, and a control circuit by means of which said deflection system or beam expansion system is controlled during or after the deflection of said electron beam onto the diaphragm to prevent overheating of the diaphragm surface.

14. Device according to claim 13, characterized in that said diaphragm is designed as a pot like vessel which allows fluid to pass through with an opening located coaxially to the beam axis.

15. Device according to claim 14, characterized in that the striking surface struck by said electron beam is inclined with respect to a line running vertically to said deflected electron beam and/or is designed with a curved surface.

16. Device according to claim 13, characterized in that the striking surface struck by said electron beam is inclined with respect to a line running vertically to said deflected electron beam and/or is designed with a curved surface.

* * * * *